(12) United States Patent
Ohta et al.

(10) Patent No.: US 8,459,108 B2
(45) Date of Patent: Jun. 11, 2013

(54) ANGULAR RATE SENSOR

(75) Inventors: Kazunori Ohta, Hitachinaka (JP); Masahide Hayashi, Mito (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 305 days.

(21) Appl. No.: 13/029,520

(22) Filed: Feb. 17, 2011

(65) Prior Publication Data

US 2011/0219873 A1 Sep. 15, 2011

(30) Foreign Application Priority Data

Mar. 12, 2010 (JP) ................................. 2010-055226

(51) Int. Cl.
  *G01P 1/02* (2006.01)
(52) U.S. Cl.
  USPC .......................................... 73/493; 73/504.01
(58) Field of Classification Search
  USPC ............. 73/493, 504.02, 504.12, 510, 514.01
  See application file for complete search history.

(56) References Cited

U.S. PATENT DOCUMENTS

| 6,892,577 B2 * | 5/2005 | Nagahara ......................... 73/493 |
| 2007/0062282 A1 | 3/2007 | Akashi et al. |
| 2009/0020419 A1 | 1/2009 | Suzuki et al. |

FOREIGN PATENT DOCUMENTS

| JP | 2000-269772 | 9/2000 |
| JP | 2001-110928 | 4/2001 |
| JP | 2004-47897 A | 2/2004 |
| JP | 2005-106481 | 4/2006 |
| JP | 2007-71677 A | 3/2007 |
| JP | 2007-166899 | 6/2007 |
| JP | 2009-33114 A | 2/2009 |
| JP | 4481323 B2 | 3/2010 |

OTHER PUBLICATIONS

Japanese Office Action mailed Jan. 29, 2013 together with English translation.

* cited by examiner

*Primary Examiner* — John Chapman, Jr.
(74) *Attorney, Agent, or Firm* — Crowell & Moring LLP (57) ABSTRACT

An angular rate sensor includes a metallic core board having a core meal layer made of a metal plate and a wiring layer including a wiring structure, a semiconductor device for detecting an angular rate fixed on the core metal layer, and a cap fixed to the wiring layer. The semiconductor device for detecting an angular rate is disposed in a hollow chamber formed by the cap and the metallic core board. The metallic core board, the semiconductor device, and the cap are molded with resin. Consequently, the angular rate sensor has a packaging structure in which electromagnetic noise resistance and moisture resistance are improved while stress applied to the semiconductor device for detecting an angular rate is reduced.

12 Claims, 7 Drawing Sheets

ANGULAR RATE SENSOR

BACKGROUND OF THE INVENTION

The present invention relates to an angular rate sensor and, more particularly, is suitably applied to an angular rate sensor having a function of detecting displacement of a structure present on the inside of a sensor.

The angular rate sensor is a device that converts an angular rate into an electric signal and detecting the angular rate. In recent years, the development of devices that detect various physical amounts such as pressure, acceleration, and an angular rate has been accelerated.

For example, as the angular rate sensor, sensors of an oscillation type, a rotation type, a gas type, and an optical type are developed. In particular, in recent years, for the purpose of improvement of mass productivity and a reduction in size, the development of oscillation type and rotation type angular rate sensors employing a silicon microfabrication technique is mainly carried out.

The oscillation type angular rate sensor is a device that causes an oscillator to oscillate at a predetermined resonant frequency and detects, as an electric signal, displacement of the oscillator involved in angular rate application from the outside.

In this way, most of the devices employing the silicon microfabrication technique detect displacement of a structure included in a semiconductor device for detecting physical amounts. Therefore, the devices sensitively react to stress or the like applied to the semiconductor device from the outside. In particular, deformation of the semiconductor device due to packaging stress generated when the semiconductor device is packaged causes a measurement error or the like and deteriorates reliability of a sensor device.

Therefore, the sensors employing the silicon microfabrication technique indispensably needs to have a packaging structure in which external force is not applied to physical amount detecting units or physical amount detecting devices. When such sensors are mounted on automobiles, in order to enable mounting of the sensors in a severe environment such as an engine room, it is indispensably necessary to adopt a packaging structure having high reliability.

As a packaging structure of electronic components including semiconductor devices such as the sensors, for example, structures such as an electronic component and an electronic module described in JP-A-2004-47897 and JP-A-2009-33114 are known. The electronic component described in JP-A-2004-47897 has a configuration in which a piezoelectric element and an electronic component are packaged on a metallic core board and covered with a metal cap connected by soldering to core metal of the metallic core board and sealing resin is filled on the inner side of the metal cap. The electronic module described in JP-A-2009-33114 has a configuration in which an electronic component is packaged on a multilayer board and covered with a metal shield electrically connected to a ground electrode of the multilayer board and the inner side of the metal shield is sealed by epoxy resin or the like.

However, in the configuration of the electronic component described in JP-A-2004-47897, since the sealing resin is filled on the inner side of the metal cap, the semiconductor device packaged on the board is deformed by stress application to the semiconductor device. In particular, when the semiconductor device employing the silicon microfabrication technique is packaged, it is difficult to secure reliability because, for example, a measurement error occurs. In the configuration of the electronic module described in JP-A-2009-33114, since the electronic component is packaged on the multilayer board, electromagnetic noise tends to be applied to the packaged electronic component. In particular, when the semiconductor device is packaged, it is difficult to secure reliability because, for example, measurement is unstable.

BRIEF SUMMARY OF THE INVENTION

It is an object of the present invention to provide a highly reliable angular rate sensor including a packaging structure in which electromagnetic noise resistance and moisture resistance are improved while stress applied to a semiconductor device for detecting an angular rate is reduced.

A semiconductor device for detecting an angular rate fixed on a core metal layer of a metallic core board having a core metal layer formed of a metal plate and a wiring layer including a wiring structure is disposed in a hollow chamber formed by a cap fixed on the wiring layer, the core metal layer formed of the metal plate, and the metallic core board. The semiconductor device, the metallic core board, and the cap are molded with resin.

According to an embodiment of the present invention, it is possible to reduce stress applied to the semiconductor device for detecting an angular rate. Therefore, it is possible to reduce a measurement error and the like of a sensor and secure reliability. The sensor has a structure that can improve electromagnetic noise resistance and moisture resistance. It is possible to provide a highly reliable angular rate sensor.

Other objects, features and advantages of the invention will become apparent from the following description of the embodiments of the invention taken in conjunction with the accompanying drawings.

DETAILED DESCRIPTION OF THE INVENTION

The present invention is explained below with reference to an embodiment.

First Embodiment

First, the configuration of an angular rate sensor according to a first embodiment and a manufacturing process for the angular rate sensor are explained.

Figure 1:
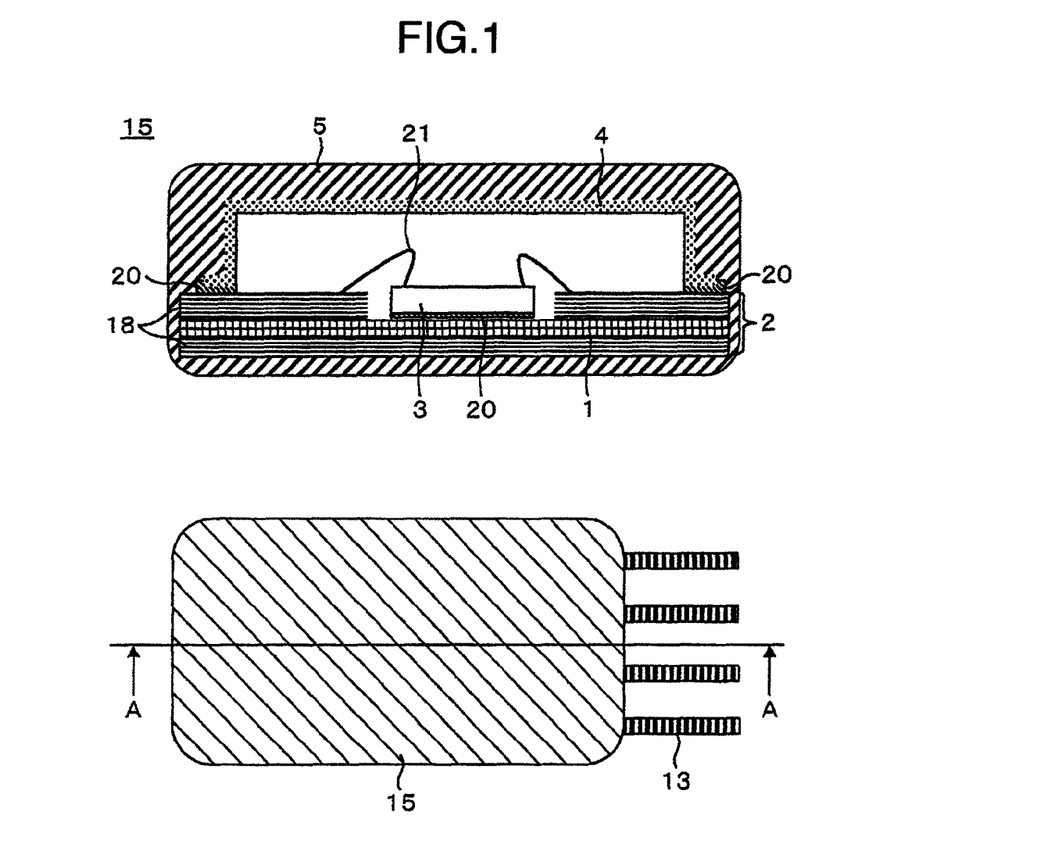
FIG. 1 is a sectional schematic view showing a sectional structure of an angular rate sensor according to the present invention.
Figure 2:
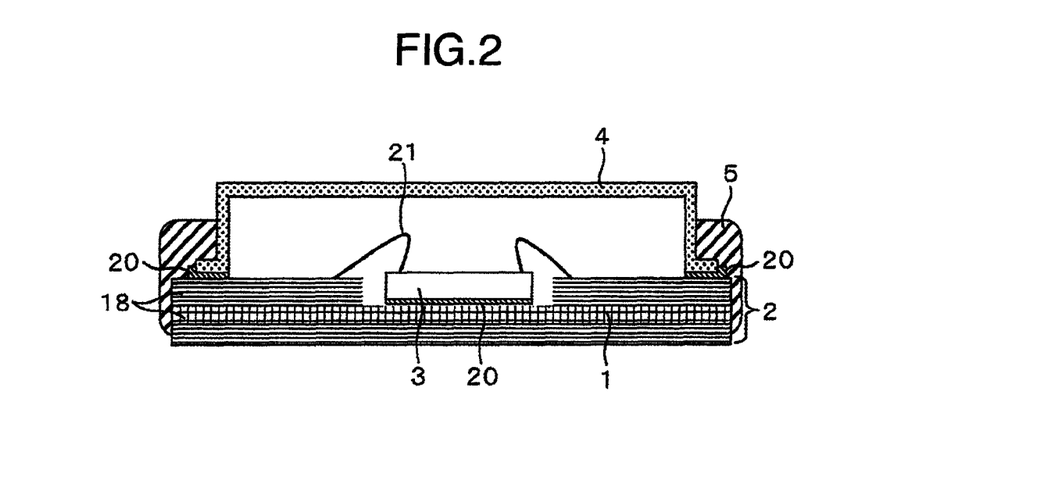
FIG. 2 is a sectional schematic view showing the sectional structure of the angular rate sensor according to the present invention.

FIGS. 1 and 2 are sectional schematic views of an angular rate sensor according to the present invention.

As shown in FIG. 1, an angular rate sensor 15 according to the present invention includes a metallic core board 2 including a core metal layer 1 formed substantially by a metal plate having thickness of, for example 0.5 mm and a wiring layer 18 of a multilayer structure including a wiring structure (an electrically conductive wiring pattern embedded in or arranged on a plastic layer), a semiconductor device 3 for detecting an angular rate, bonding wires 21 that electrically connect the semiconductor device 3 and the wiring layer 18 to each other, a cap 4 fixed onto the wiring layer 18, lead terminals 13 for extracting a signal of the semiconductor device 3 for detecting an angular rate, and resin for molding the entire angular rate sensor 15.

The angular rate sensor 15 according to the present invention is formed in a structure in which the core metal layer 1 is exposed by providing a cavity in the wiring layer 18 of the metallic core board 2, which includes the core metal layer 1 made of the metal plate or the like having thickness of, for example, 0.5 mm and the wiring layer 18, the semiconductor device 3 for detecting an angular rate is die-bonded to the exposed core metal layer 1 by an adhesive (resin) 20, and the semiconductor device 3 and the wiring layer 18 are electrically connected by the bonding wires 21. The semiconductor device 3 is fixed on the core metal layer 1 having strength higher than that of the wiring layer 18. Therefore, it is possible to reduce packaging stress applied to the semiconductor device 3 such as bending by molding.

The angular rate sensor 15 may include a semiconductor device (not shown) for detecting acceleration in the same place as the semiconductor 3 for detecting an angular rate and have a function of detecting acceleration.

The angular rate sensor 15 may be formed in a structure having high moisture resistance in which the cap 4 is fixed to the wiring layer 18 of the metallic core board 2 by the adhesive 20, whereby the cap 4 and the metallic core board 2 form a hollow chamber, and the semiconductor device 3 is disposed in the hollow chamber, whereby the semiconductor device 3 is substantially entirely covered with metal and not in contact with the external air.

The angular rate sensor 15 may be formed in a structure having higher moisture resistance by filling inert gas such as nitrogen gas (not shown) in the hollow chamber formed by the cap 4 and the metallic core board 2.

The angular rate sensor 15 may be formed in a structure having a higher moisture resistance by disposing a getter material for moisture absorption such as silica gel (not shown) in the hollow chamber formed by the cap 4 and the metallic core board 2.

Since the cap 4 is not directly fixed to the core metal layer 1, the wiring layer 18 and the cap 4 receives external force such as packaging stress, whereby it is possible to reduce external force application to the semiconductor device 3 fixed on the core metal layer 1. Therefore, the angular rate sensor 15 is formed in a structure in which moisture resistance is further improved while the external force application to the semiconductor device 3 is reduced by mold-sealing, with resin 5, the outer side of the hollow chamber formed by the cap 4 and the metallic core board 2.

As shown in FIG. 2, the angular rate sensor 15 may be formed in a structure in which a range mold-sealed by the resin 5 is set only in, for example, a metal cap attaching portion to limit the range to be mold-sealed, whereby packaging stress such as bending to be applied is limited and the stress application to the semiconductor device 3 is further reduced.

Figure 3:
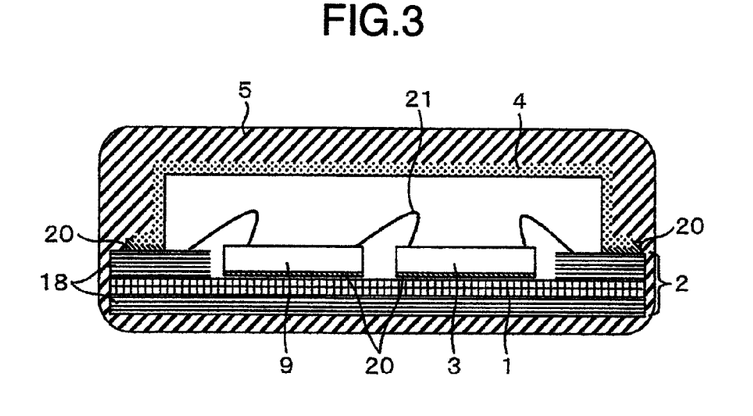
FIG. 3 is a sectional schematic view showing the sectional structure of the angular rate sensor according to the present invention.

FIG. 3 is a sectional schematic view of the angular rate sensor according to the present invention.

As shown in FIG. 3, the angular rate sensor 15 according to the present invention is formed in a structure including means for improving electromagnetic noise resistance by die-bonding, with the adhesive 20, a single processing device 9 for performing amplification and the like of a signal to the exposed core metal layer 1 and stabilizing rear surface potential of the signal processing device 9 and processing a signal from the semiconductor device 3 by electrically connecting the signal processing device 9 to the semiconductor device 3 and the wiring layer 18 with a boding wire 21.

Figure 4:
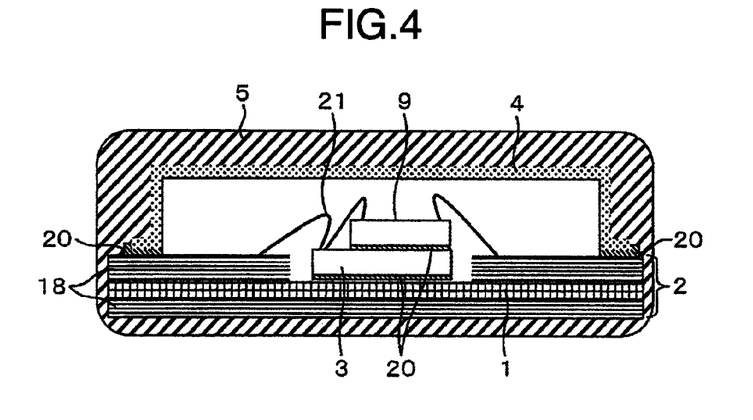
FIG. 4 is a sectional schematic view showing the sectional structure of the angular rate sensor according to the present invention.

As shown in FIG. 4, the angular rate sensor 15 may be formed in a structure in which the signal processing device 9 is die-bonded to the exposed core metal layer 1 by the adhesive 20 and the semiconductor device 3 is stacked and fixed on the signal processing device 9 by the adhesive 20 and a structure in which it is possible to reduce a packaging area while improving electromagnetic noise resistance of the signal processing device 9 by electrically connecting the signal processing device 9, the semiconductor device 3, and the wiring layer 18 to one another with the bonding wires 21.

Figure 5:
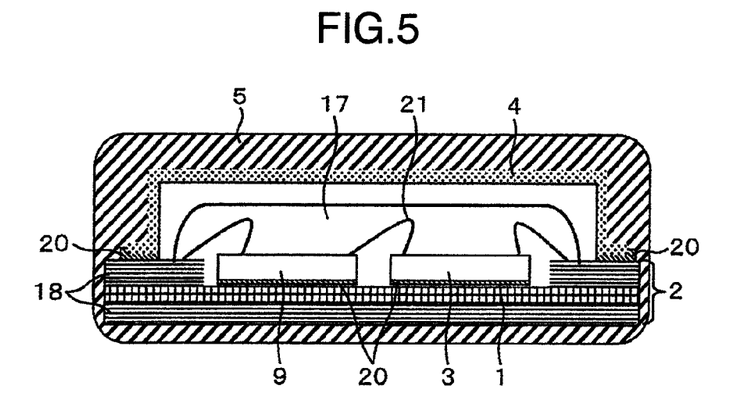
FIG. 5 is a sectional schematic view showing the sectional structure of the angular rate sensor according to the present invention.

As shown in FIG. 5, the angular rate sensor 15 is formed in a structure in which moisture resistance is further improved by potting gel 17 on the semiconductor device 3 and the signal processing device 9 disposed in the hollow chamber formed by the cap 4 and the metallic core board 2.

Figure 6:
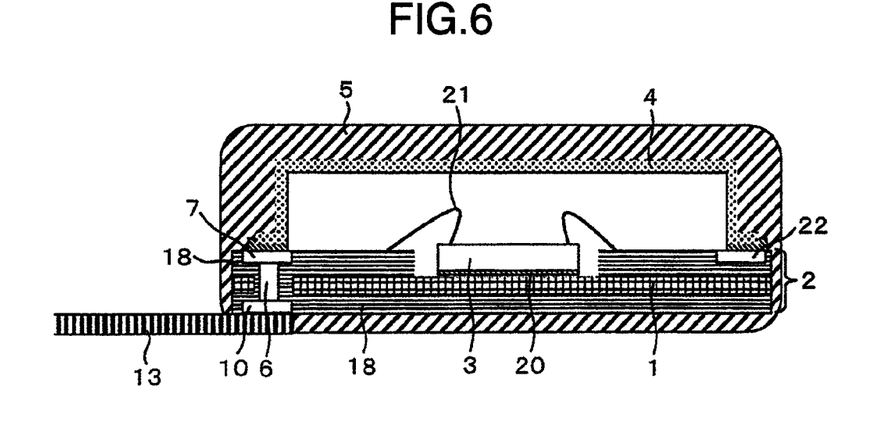
FIG. 6 is a sectional schematic view showing the sectional structure of the angular rate sensor according to the present invention.
Figure 7:
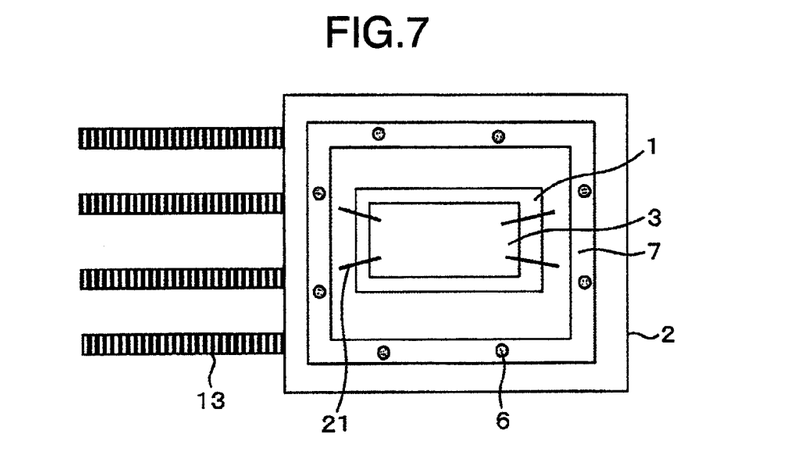
FIG. 7 is a schematic diagram showing a packaging structure of the angular rate sensor according to the present invention.

FIG. 6 is a sectional schematic view of the angular rate sensor according to the present invention. FIG. 7 is a schematic diagram including a perspective view of only a conductor pattern 7 excluding the cap 4, the resin 5, and a conductive joining material 22 of the angular rate sensor according to the present invention.

As shown in FIGS. 6 and 7, the angular rate sensor 15 according to the present invention is formed in a structure in which the conductor pattern 7 is provided so as to surround the semiconductor device 3 on the front surface of the wiring layer 18, the cap 4 made of a metal material such as aluminum or a 42 alloy is joined to the conductor pattern 7 by the conductive joining material 22 such as solder or a conductive adhesive, and the conductor pattern 7 is connected to a ground side through a via line 6 and a pad 10 provided on the metallic core board 2, whereby, since the semiconductor device 3 is surrounded by a metal material connected to the ground side, electromagnetic noise resistance and moisture resistance are improved. The lead terminals 13 may be connected to the pad 10 and the conductor pattern 7 may be connected to the ground side using the lead terminals 13.

The angular rate sensor 15 may be formed in a structure in which, to make the via line 6 and the pad 10 of the metallic core board 2 unnecessary, a cavity is provided to surround the semiconductor device 3 on the front surface of the wiring layer 18, the core metal layer 1 is exposed, the cap 4 made of the metal material is joined to the exposed core metal layer 1 by the conductive joining material 22 such as solder or a conductive adhesive, and the core metal layer 1 is connected to the ground side, whereby the semiconductor device 3 is surrounded by the metal material connected to the ground side and electromagnetic noise resistance and moisture resistance are improved. However, when the angular rate sensor 15 is formed in such a structure, since the wiring layer 18 in a portion surrounded by the cavity is formed as an island pattern, it is extremely difficult to manufacture the metallic core board 2 having a multilayer structure.

Figure 8:
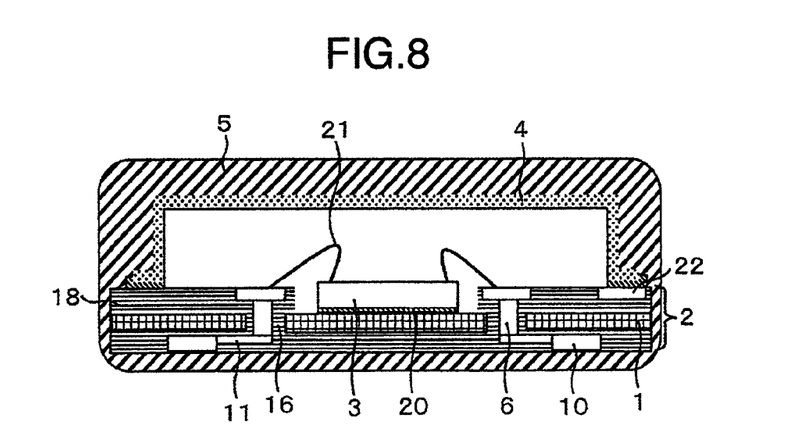
FIG. 8 is a sectional schematic view showing the sectional structure of the angular rate sensor according to the present invention.

FIG. 8 is a sectional schematic view of the angular rate sensor according to the present invention.

As shown in FIG. 8, the angular rate sensor according to the present invention is formed in a structure in which the semiconductor device 3 for detecting an angular rate is die-bonded to the exposed core metal layer 1 by the adhesive 20, the semiconductor device 3 and pads 10 provided on the wiring layer 18 are electrically connected by the bonding wires 21, via holes 16 in at least one or more places are opened in the core metal layer 1 of the metallic core board 2, via lines 6 are inserted through the via holes 16, and the pads 10 provided on the front surface of the wiring layer 18, internal wires 11 provided in the metallic core board 2, and the pads 10 provided on the rear surface of the metallic core board 2 are electrically connected, whereby a signal of the semiconductor device 3 can be extracted from the pads 10 provided on the rear surface of the metallic core board 2.

Figure 9:
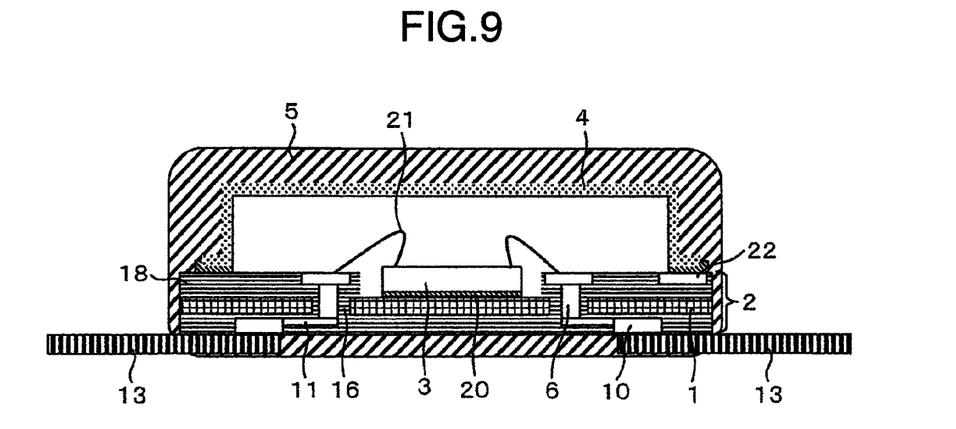
FIG. 9 is a sectional schematic view showing the sectional structure of the angular rate sensor according to the present invention.
Figure 10:
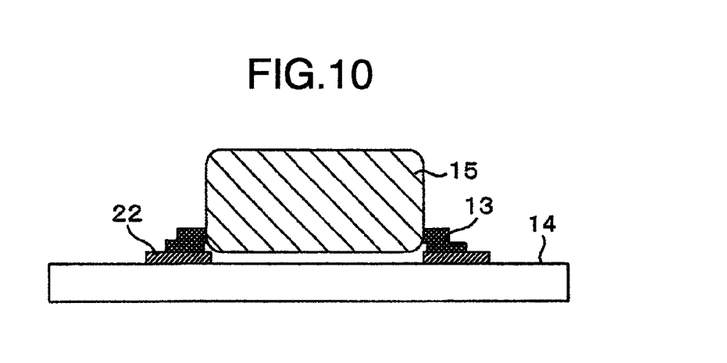
FIG. 10 is a schematic diagram showing a board mounting structure of the angular rate sensor according to the present invention.
Figure 11:
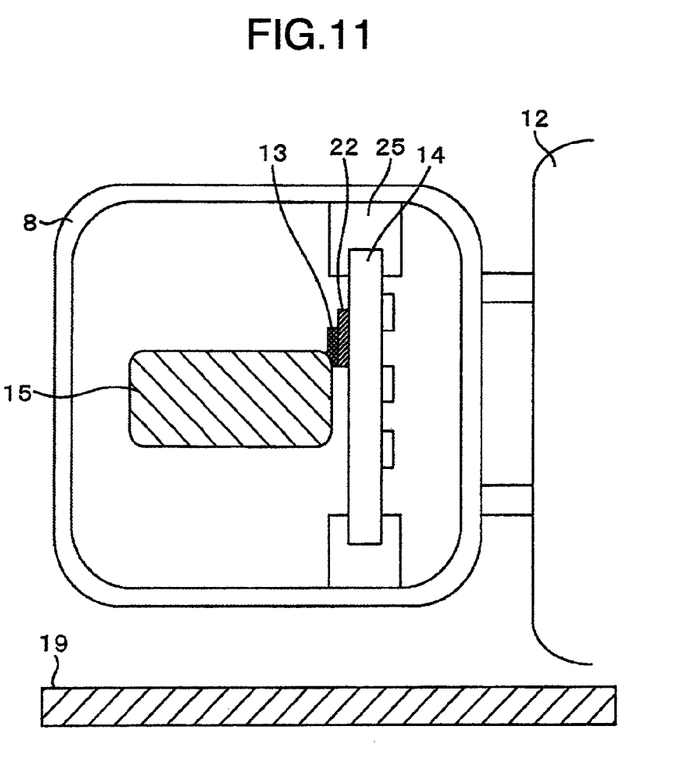
FIG. 11 is a schematic diagram showing an automobile mounted structure of the angular rate sensor according to the present invention.
Figure 12:
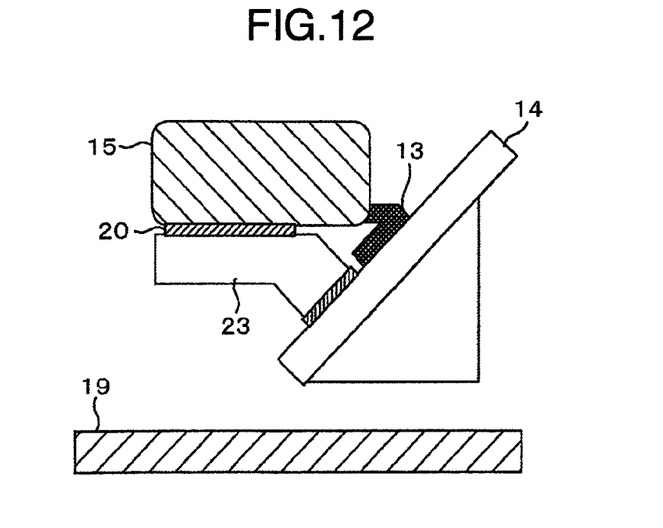
FIG. 12 is a schematic diagram showing a board mounting structure of the angular rate sensor according to the present invention.

FIG. 9 is a sectional schematic view of the angular rate sensor according to the present invention. FIGS. 10, 11, and 12 are packaging schematic diagrams of the angular rate sensor according to the present invention.

As shown in FIG. 9, the angular rate sensor according to the present invention is formed in a structure in which the lead terminals 13 are connected to the pads 10 provided on the rear surface of the metallic core board 2 and an output of the semiconductor device 3 can be extracted from the lead terminals 13. Therefore, as shown in FIG. 10, the angular rate sensor is formed in a structure in which the lead terminals 13 are joined to a packaging board 14 such as a printed board using the conductive joining material 22 such as solder and the conductive joining material 22 and the lead terminal 13 receive external force such as deformation or distortion of the packaging board 14 due to thermal stress, whereby it is possible to reduce external force application to the semiconductor device 3 in the angular rate sensor 15.

As shown in FIG. 11, when the angular rate sensor according to the present invention is mounted on an automobile, the angular rate sensor is often mounted on the packaging board 14 fixed by board holders 25 in a control unit 8 included in an engine room wall 12. The packaging board 14 in the control unit 8 is often fixed in a state in which the packaging board 14 stands vertically with respect to the ground 19. However, the angular rate sensor according to the present invention is formed in a structure in which the lead terminals 13 are bent and joined to the packaging board 14 using the conductive joining material 22 such as solder, whereby it is possible to mount the angular rate sensor 15 in the control unit 8 without changing a detection axis of the angular rate sensor 15.

As shown in FIG. 12, the angular rate sensor according to the present invention is formed in a structure in which, even when the packaging board 14 mounted with the angular rate sensor is fixed in a state oblique to the ground 19, the lead terminals 13 are bent and joined to the packaging board 14 using the conductive joining material 22 such as solder, whereby it is possible to mount the angular rate sensor 15 in the control unit 8 without changing the detection axis of the angular rate sensor 15.

Further, the angular rate sensor according to the present invention may be formed in a structure in which a holder 23 made of metal is bonded to the packaging board 14 and the angular rate sensor 15 by the adhesive, whereby shift of a mounting angle can be prevented.

Figure 13:
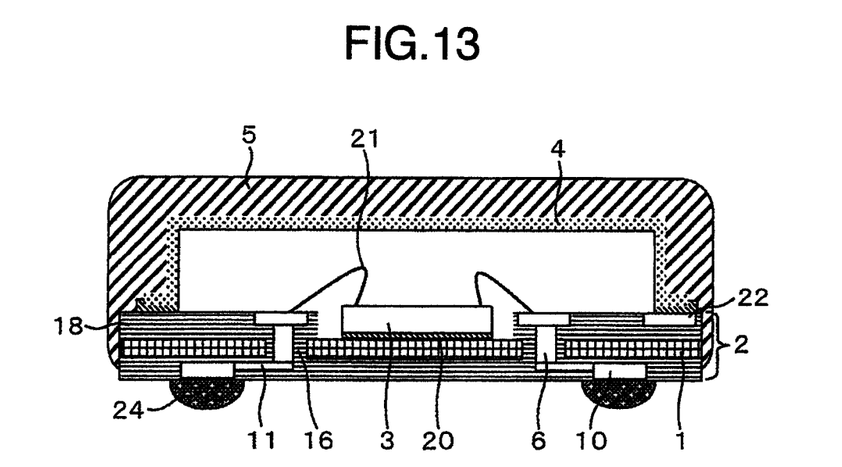
FIG. 13 is a sectional schematic view showing the sectional structure of the angular rate sensor according to the present invention.
Figure 14:
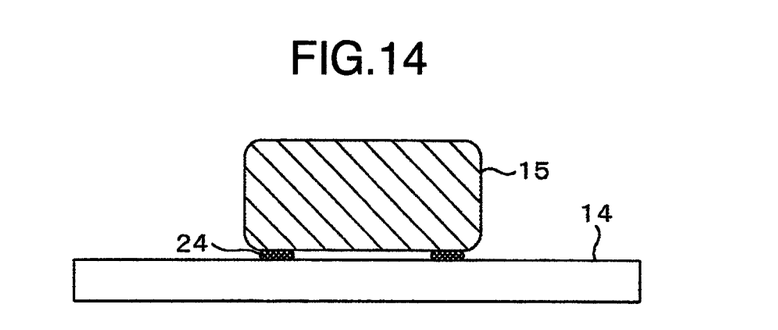
FIG. 14 is a schematic diagram showing a board mounting structure of the angular rate sensor according to the present invention.

FIG. 13 is a sectional schematic view of the angular rate sensor according to the present invention. FIG. 14 is a packaging schematic diagram of the angular rate sensor according to the present invention.

As shown in FIG. 13, the angular rate sensor according to the present invention is formed in a structure in which solder balls 24 are connected to the pads 10 provided on the rear surface of the metallic core board 2 and an output of the semiconductor device 3 can be extracted from the solder balls 24. Therefore, as shown in FIG. 14, the angular rate sensor is formed in a structure in which the angular rate sensor 15 is bonded to the packaging board 14 such as a printed board using the solder balls 24, whereby it is possible to reduce a packaging area. It is also possible to mount the angular rate sensor according to the present invention in a limited space such as the inside of a cabin or an engine room of an automobile.

FIGS. 15A to 15D are sectional schematic views showing a manufacturing process for the angular rate sensor according to the present invention.

Figure 15:
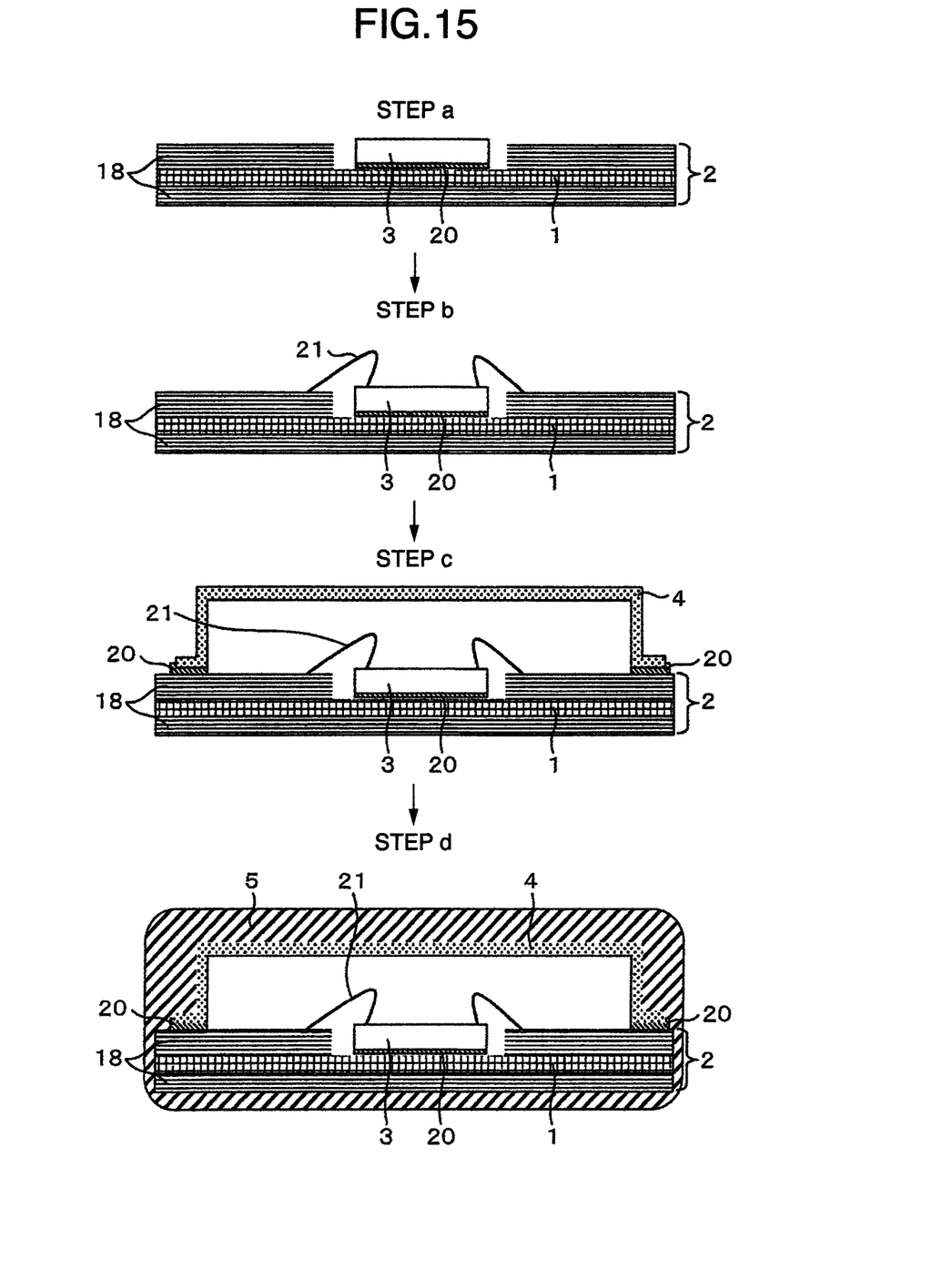
FIG. 15 includes sectional schematic views showing respective steps a-d for manufacturing the angular rate sensor according to the present invention.

When the angular rate sensor according to the present invention is manufactured, as shown in step a in FIG. 15, at first, the metallic core board 2 including the core metal layer 1 made of the metal board and the wiring layer 18 of the multilayer structure including the wiring structure is prepared. The semiconductor device 3 for detecting an angular rate is die-bonded by the adhesive 20 to the core metal layer 1 exposed by the cavity provided in the wiring layer 18 of the metallic core board 2. As the metallic core board 2, a board sheet formed by connecting a large number of metallic core boards 2 may be prepared. Packaging stress or the like applied to the semiconductor device 3 may be reduced by die-bonding the semiconductor device 3 with, for example, the soft adhesive 20 such as a silicon adhesive.

As shown in step b in FIG. 15, the semiconductor device 3 and the wiring layer 18 are electrically connected by the bonding wires 21.

As shown in step c in FIG. 15, the cap 4 is fixed to the wiring layer 18 of the metallic core board 2 by the adhesive 20, whereby a hollow chamber is formed by the cap 4 and the metallic core board 2. When inert gas such as nitrogen gas (not shown) is filled in the hollow chamber, after vacuuming is once carried out in a vacuum chamber, the cap 4 may be fixed in a state in which the gas is filled in the hollow chamber.

Finally, as shown in step d in FIG. 15, the outer side of the hollow chamber formed by the cap 4 and the metallic core board 2 is mold-sealed by the resin 5.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. An angular rate sensor comprising,
a metallic core board including a core metal layer and a wiring layer,
a semiconductor element fixed onto the core metal layer to measure an angular rate, and
a cap fixed onto the wiring layer to contain the semiconductor element in a chamber formed by the cap and the metallic core board,
wherein the angular rate sensor further comprises a resin adhering to each of the metallic core board and the cap.

2. The angular rate sensor according to claim 1, further comprising a signal processing circuit chip contained in the chamber to process a signal generated by the semiconductor element.

3. The angular rate sensor according to claim 1, wherein the cap is made of a metal, the wiring layer has an electrically conductive pattern surrounding the semiconductor element, the electrically conductive pattern is joined with the cap, and the electrically conductive pattern is electrically grounded.

4. The angular rate sensor according to claim 1, wherein the wiring layer includes a cavity through which a part of the core metal layer is exposed, and the semiconductor element fixed onto the exposed part of the core metal layer.

5. The angular rate sensor according to claim 4, wherein the chamber includes another element onto which the semiconductor element is fixed, and the another element is arranged in the cavity.

6. The angular rate sensor according to claim 1, wherein the chamber includes an inert gas as an environmental gas.

7. The angular rate sensor according to claim 1, wherein the chamber includes a gel covering the semiconductor element.

8. The angular rate sensor according to claim 1, wherein the resin adheres to only a joint between the metallic core board and the cap.

9. The angular rate sensor according to claim 1, wherein the core metal layer includes at least one via hole and via line extending through the via hole to enable a signal generated by the semiconductor element to be transmitted to a pad arranged on a reverse side of the metallic core board.

10. The angular rate sensor according to claim 9, further comprising a lead terminal joined with the pad so that the signal is taken out from the angular rate sensor.

11. The angular rate sensor according to claim 10, wherein the pad includes a solder ball through which the signal is taken out from the angular rate sensor.

12. The angular rate sensor according to claim 1, further comprising an acceleration detecting element arranged in the chamber.

* * * * *